United States Patent [19]

Song

[11] Patent Number: 5,568,425

[45] Date of Patent: Oct. 22, 1996

[54] PROGRAM DRAIN VOLTAGE CONTROL FOR EPROM/FLASH

[75] Inventor: Paul J. Song, Sunnyvale, Calif.

[73] Assignee: Integrated Silicon Solution, Inc., Sunnyvale, Calif.

[21] Appl. No.: 596,408

[22] Filed: Feb. 2, 1996

[51] Int. Cl.$^6$ .................................................. G11C 13/00
[52] U.S. Cl. ........................................ 365/185.33; 365/218
[58] Field of Search ............................. 365/185.33, 218, 365/201

[56] References Cited

U.S. PATENT DOCUMENTS 5,140,553   8/1992   Choi et al. ................................ 365/201

*Primary Examiner*—Terrell W. Fears
*Attorney, Agent, or Firm*—Flehr, Hohbach, Test, Albritton & Herbert

[57] ABSTRACT

A program drain voltage control system is disclosed for use within an EPROM/flash memory system wherein each memory cell is coupled in series with plural y selection transistors. When the EPROM/flash memory system is in programming mode, the control system maintains the program drain voltage of EPROM/flash memory cells being programmed at a target drain voltage (+6.1 VDC). Drain voltage control is accomplished using a current control circuit and a voltage control circuit. The voltage control circuit uses a comparator driven by a voltage reference signal (+1.28 VDC) derived from the bandgap reference and by a voltage divider output. When the output from the voltage divider is larger than the reference voltage, the comparator output goes high, turning on a pulldown transistor, which pulls down the node where the target voltage is to be established. So that the target drain voltage is correctly mirrored at the drain of the memory cells being programmed, the target drain voltage is coupled to the drain of a first of the y selector transistor through a like number of identical pass transistors. The current control circuit uses a n-channel native transistor whose gate is coupled to the same voltage reference (1.28 VDC) to generate a known drain voltage for a second EPROM/flash memory cell. This causes the second memory cell to draw a known current that is multiplied and then mirrored into the voltage control circuit so that the target drain voltage is achieved at currents that approximate actual memory cell programming currents.

11 Claims, 3 Drawing Sheets

PROGRAM DRAIN VOLTAGE CONTROL FOR EPROM/FLASH

The present invention relates generally to semiconductor flash memory systems, and more specifically to providing on-chip control of program drain voltage for such memory systems.

BACKGROUND OF THE INVENTION

Solid state and so-called flash memories are known in the art. An individual flash memory cell includes a metal-oxide-semiconductor ("MOS") device having spaced-apart drain and source regions fabricated on a substrate and defining a channel region therebetween. A very thin gate oxide layer overlies the channel region, and a floating charge-retaining storage gate overlies the channel region and is unconnected to the cell. A control gate at least partially overlies the floating gate and is insulated therefrom.

In practice, a plurality of such memory cells is arrayed in addressable rows and columns to form a flash memory array. Individual cells in the array are accessed for purposes of writing, reading or erasing data by decoding row and column information.

Typically, the control gates for a group of cells in a given row are formed from a continuous strip of conductive material that defines a so-called word line, abbreviated "WL". A word line might comprise, for example, a group of eight cells that collectively store one byte. For a given column in the array, the drain leads of all cells in the column are coupled to a so-called bit line, abbreviated "BL". The source leads of the various cells are collectively switchably coupled to one of several potential levels, depending upon whether cells in the array are to be programmed (written) or erased or are to be read.

Within the memory array, an individual cell is addressed and thus selected for reading, programming(writing) or erasing by specifying its row (or word line) as an x-axis coordinate, and its column (or bit line) as a y-axis coordinate. A 16 K-bit memory, for example, may comprise an array of 128×128 bits, in which there are 128 x-axis word lines and 128 y-axis bit lines. Commonly, blocks of memory cells are collectively grouped into sectors. Cell addressing is accomplished by coupling address bits to precoding x-decoders and to precoding y-decoders whose respective outputs are coupled to word lines and bit lines in the array.

Programming an addressed MOS memory cell occurs in a program mode by accelerating so-called hot electrons (from the device substrate). These electrons are injected from the drain region through the thin gate oxide and onto the floating gate. The control gate-source threshold voltage required before substantial MOS device drain-source current occurs is affected by the amount of such charge retained on the floating gate. Thus, storage cell programming forces the floating storage gate to retain charge that will cause the cell to indicate storage of either a logical "1" or "0" in a read-out mode.

The above-described storage cells are non-volatile in that the charge on the storage gate, and thus the "0" or "1" bit stored in the cell, remains even when control and operating voltages to the array are turned off. In the program (write) mode, the control gate is coupled to a high positive potential of perhaps +10 VDC, the drain is coupled to perhaps +6 VDC, and the source and substrate are grounded (meaning that they are coupled to the circuit ground node ). This causes the hot electrons to be generated and captured by the floating gate. In a read mode, the charge stored on the floating gate of an addressed MOS memory cell is read by coupling perhaps +5 VDC to the control gate, and reading drain-to-source current. The presence or absence of charge on the stored gate will define a binary "1" or "0" bit that is read-out from the addressed memory cell by a sense amplifier coupled to the bit line.

In an erase mode, the electrons trapped on the floating gates of a group of addressed MOS memory cells are encouraged to flow by electron tunneling to the source. During this erase mode, a group of negative erase word line decoders cause the addressed cells' control gates to be coupled to perhaps −9 VDC, the sources to perhaps +5 VDC, the drains to float, with the substrates being grounded. In a flash memory configuration, entire sector-sized blocks of cells may be simultaneously erased, e.g., erased in a "flash".

In the various read, program or erase modes, the word lines (e.g., control gates) are pulled up or down to the appropriate voltage levels by x-decoder circuitry. One portion of such circuitry, a positive-side word line decoder, pulls selected word lines up to VCC during normal read mode and to the larger positive potential (e.g., +10 VDC) during program mode, and grounds unselected word line sectors. Another portion of the circuitry, a negative-side word line decoder, pulls selected word lines down to a large negative potential (e.g., −10 VDC) during erase mode. There is no DC current path through the word lines in the various modes because the positive and negative decoding circuits never turn on at the same time.

For programming to be effective, the drain voltage of the flash memory cells being programmed must be held at a predetermined level (e.g. 6.1 VDC) for the duration of the programming step. However, due to the various Y address select transistors that intervene between the flash cells and the external programming voltage supply (VPPESD, which is between +11 and +12 VDC), it is not possible to directly control the drain voltage of flash cells during programming. Consequently, prior art devices indirectly set the flash cell drain voltage by setting the drain voltage of one of the y select transistors at a level that, assuming fixed voltage drops across the various intervening transistors at a presumed drain current, should provide the correct flash cell program drain voltage. However, due to temperature changes and power supply and fabrication variations, the drain current drawn by the flash cell during programming and the voltage drops across the y select transistors are likely to vary from the values envisioned by the flash cell designer. Consequently, the drain voltage will also vary, possibly below the required programming level.

Thus, in an EPROM or flash memory array, there is a need for a program drain voltage control system that provides a program drain voltage that is consistent at the correct programming level in the face of temperature changes and external power supply variation.

SUMMARY OF THE INVENTION

The present invention is a system for controlling the program drain voltage of flash memory cells used in EPROM/flash memory arrays.

The drain voltage control system uses a feedback circuit and a steady reference voltage, such as a band gap reference, to maintain a target drain voltage at a circuit node that is remote from the drain of the flash cell being programmed. So that the target drain voltage is mirrored at the flash cell drain regardless of the characteristics of the Y select transistors intervening between the flash cell and the voltage supply, the target drain voltage is coupled to the voltage supply node through a set of transistors that match physically in layout (i.e., size and type) the y select transistors. This arrangement compensates for variations in transistor characteristics due to temperature variations.

In a second aspect of the present invention, to provide an even more accurate drain program voltage, the drain voltage control system generates the target drain voltage at a current that approximates the actual current drawn by a flash cell during programming. This is achieved by using a flash cell to generate an appropriate reference current for use in the feedback circuit.

More specifically, the present invention is a program drain voltage control system for use in an EPROM/flash memory system that includes a plurality of memory cells and a plurality of Y selection transistors arranged in N-member subsets, each of which is connected in series with a respective memory cell. Each Y selection transistor in each subset has a gate that is responsive to a respective Y select signal. Thus, to program, read or erase a selected memory cell, the memory system must activate all of the Y select signals associated with the subset of Y selection transistors coupled to the selected memory cell.

The present invention includes a feedback control circuit that is configured to maintain a first node at a stable target drain voltage through the use of a reference voltage derived from a bandgap reference. Cooperating with the feedback control circuit is a compensation circuit that includes a N-member set of pass transistors connected in series, each of which matches physically in layout (i.e., size and type) the Y selection transistors. One end of the compensation circuit is coupled to the feedback control circuit at the first node and the other end is coupled to a voltage mirroring circuit. This voltage mirroring circuit includes first and second identically fabricated transistors whose gates are coupled to a second node, the voltage at which is determined by the voltage at the other end of the compensation circuit, which is coupled to the source of the first transistor. The voltage at the second node is coupled to the Y selection transistors via the source of the second transistor. When the transistors composing the compensation network, the voltage mirror network and the Y selection subset are saturated (i.e., when the memory system is in programming mode), the target drain voltage is mirrored at the drain of the selected flash memory cell within preset drain voltage variation limits because the voltage drops across the compensation circuit and the Y selection network are approximately the same.

To achieve even finer program drain voltage control, the program drain voltage control system can also be configured with a current control branch. The current control branch includes a second flash memory cell that is fabricated identically to the plurality of flash memory cells, the control gate of the second flash memory cell being driven by a positive high voltage signal when the memory system is in a programming mode. Cooperating with the current control branch is a voltage setting circuit that is configured to set the drain voltage of the second flash memory cell to a predetermined voltage that is large enough to turn on the second cell but not program the second cell. Using this arrangement, when the memory system is in the programming mode and when the drain voltage of the second memory cell is set to the predetermined voltage, the second cell draws a reference current that is a known fraction of the drain current drawn by a memory cell during programming. The drain voltage control system also includes a current mirror coupled to the end of the voltage setting circuit that is distal to the drain of the second memory cell. This current mirror multiplies the reference current by the reciprocal of the known fraction and provides at the second node a second current for use by the feedback and compensation circuits. This second current approximates the programming current within accepted limits.

Other features and advantages of the invention will appear from the following description in which the preferred embodiments have been set forth in detail in conjunction with the accompanying drawings.

DESCRIPTION OF THE PREFERRED EMBODIMENT

Figure 1:
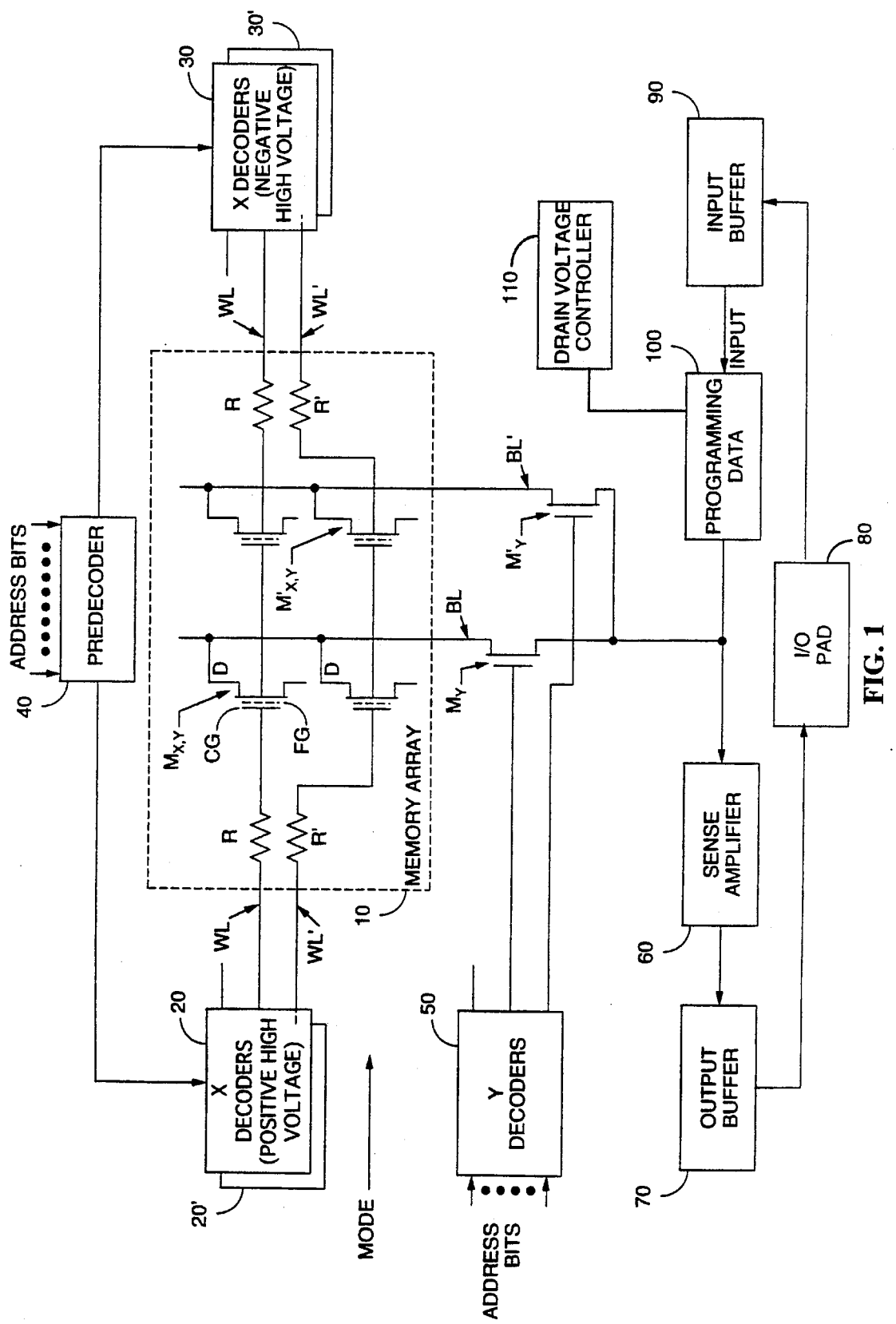
FIG. 1 depicts an EPROM/flash memory system with which the present invention may be practiced.

FIG. 1 is a block diagram of an EPROM or flash memory cell architecture with which the present invention may be practiced. A memory array 10 includes a plurality of MOS memory cells such as cells $M_{x,y}$ and $M'_{x,y}$, each cell having source and drain regions, a floating gate (denoted FG) and a control gate (denoted CG). A plurality of such cells in a given horizontal (or x-axis) row have their control gates coupled together to form a word line (WL).

Each word line is selectively pulled-up or pulled-down to a program, read or erase voltage level by an x-axis positive high voltage decoder or by an x-axis negative high voltage decoder. Two word lines are shown in FIG. 1, WL being pulled-up or down by decoder 20 or 30, and word line WL' being pulled-up or down by decoder 20' or 30'. To minimize high voltage switching transients, each word line preferably includes an associated series resistance 2R of a few KΩ.

Although only two word lines are shown in FIG. 1, the array 10 will include many word lines. In practice, it is common to treat groups of eight word lines as a common block, in which case there will be eight associated positive high voltage x-decoders and eight associated negative high voltage x-decoders.

A predecoder 40 receives input address information from a host device such as a microprocessor computing system (not shown) and outputs appropriate signals to the decoders, e.g., 20 and 30. In turn, the appropriate decoders will pull an associated word line up or down to a necessary voltage level.

More specifically, positive high voltage x-decoder 20 pulls a selected word line WL in memory array 10 up to about +10 VDC in program/write mode, and up to VCC (e.g., ≈+5 VDC) in read mode. Negative high voltage x-decoder 30 pulls the same word line WL down to about −9 VDC in erase mode (if the word line is selected), or down to 0 VDC if unselected in erase mode or in read mode. If word line 30 is unselected, in program/write mode, decoder 30 pulls the word line down to 0 VDC. Depending upon the potential to which selected word line WL is pulled by decoder 20 or by decoder 30, information in cell $M_{x,y}$ may be read out, erased, or new information may be programmed/written into this cell.

A y-decoder 50 also receives address information from the host device. In conventional fashion, a plurality of cells in a column in the array have their source regions coupled together to form a bit line (BL). The output from the y-decoder 50 turns-on a y-axis select transistor, e.g., $M_y$, which couples the bit line signal to the input of a sense amplifier 60 that reads the stored bit of information in the address-selected cell $M_{x,y}$. If, instead, cell $M'_{x,y}$ is to be read, the y-decoder 50 will turn on the select transistor $M'_y$. For ease of illustration, only two bit lines, BL and BL', are depicted in FIG. 1 although in practice array 10 will include a great many bit lines. The program drain voltage for the memory cells $M_{x,y}$ and $M'_{x,y}$ is controlled by the program drain voltage controller 110, which is described below in reference to FIG. 3.

Figure 2:
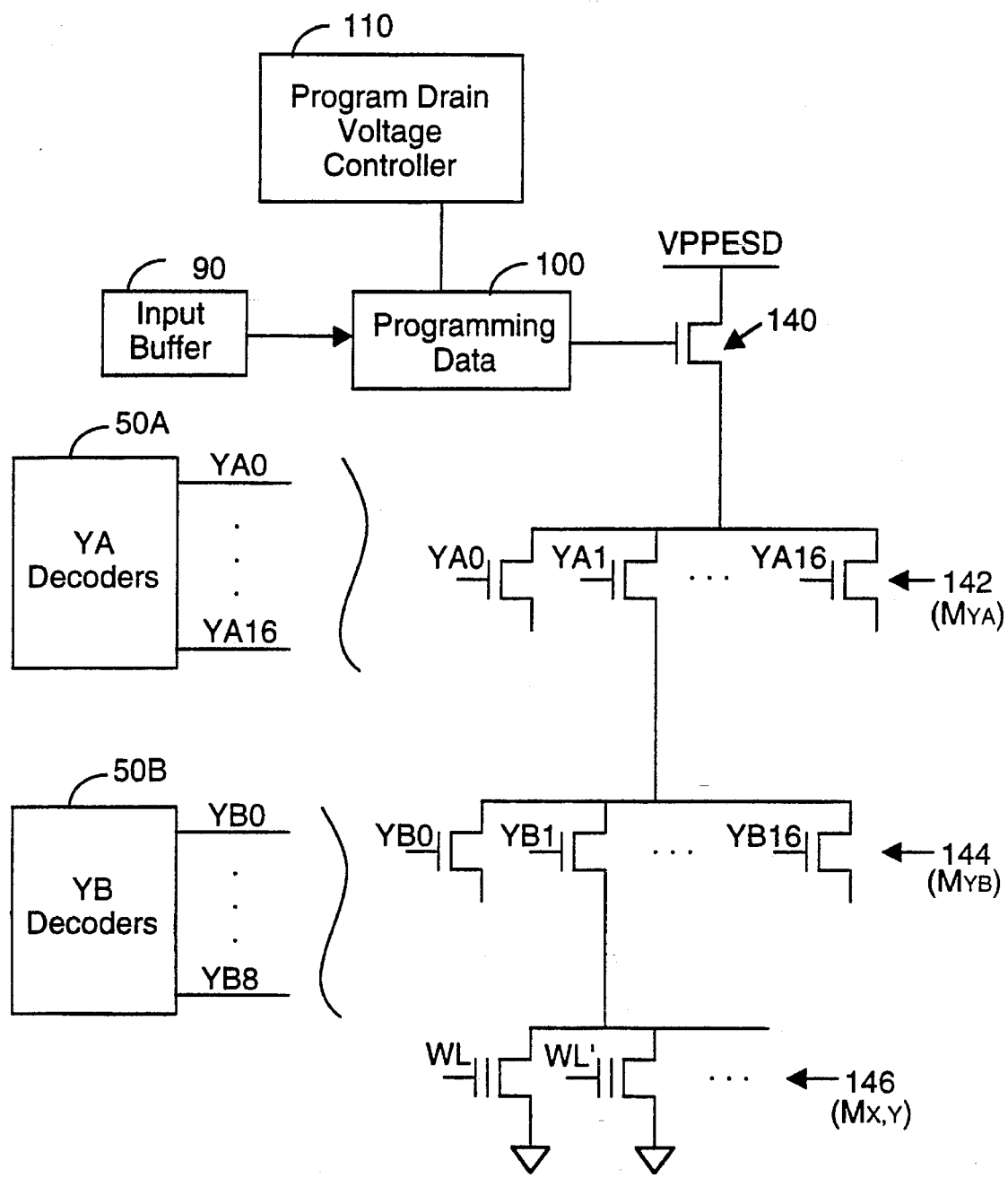
FIG. 2 depicts an alternative embodiment of y decoding circuitry, which includes multiple levels of y decoders and select transistors.

In some flash memory systems, instead of using a single y-decoder, multiple sets of y-decoders are used, each set providing a different level of y-decoding. For example, referring to FIG. 2, a "B" decoder 50B provides multiple YB select signals that define the y index of a cell when used in combination with YA select signals provided by an "A" decoder 50A. In the preferred embodiment, there are eight different YB select signals and sixteen different YA select signals, each coupled to a respective YA ($M_{YA}$) or YB ($M_{YB}$) select transistor as shown in FIG. 2. Given this configuration, a flash memory cell $M_{x,y}$ coupled in series to the YA and YB select transistors can only be erased, read or programmed when both of its select transistors are active. For example, the transistor $M'_{x,y}$ can only be programmed when the y select lines YA1 and YB1 are simultaneously held high by the YA and YB decoders. Consequently, during programming, the drain program voltage controller 110, which is coupled to the source of all of the YA select transistors $M_{YA}$ through the programming data 100 and the switching transistor 140, provides a program drain voltage that takes into account the voltage drops across one $M_{YA}$, and one $M_{YB}$ transistor.

In a read mode of operation, the sense amplifier output is coupled through an output buffer 70. The "0" or "1" signal stored in an addressed cell $M_{x,y}$ is then provided to an input/output pad 80, from where the information may be accessed by the host device.

Data to be stored within the array 10 is coupled to the input/output pad 80 by the host device, from where the data are coupled to an input buffer 90. The output of buffer 90 is provided to an interface 100 that provides suitable programming data for the array at voltage levels that are set by the drain voltage controller, which is coupled to another input of the programming data interface 100. The system shown in FIG. 1 also receives from the host device signals commanding either a program/write mode, erase mode, or a read mode.

Figure 3:
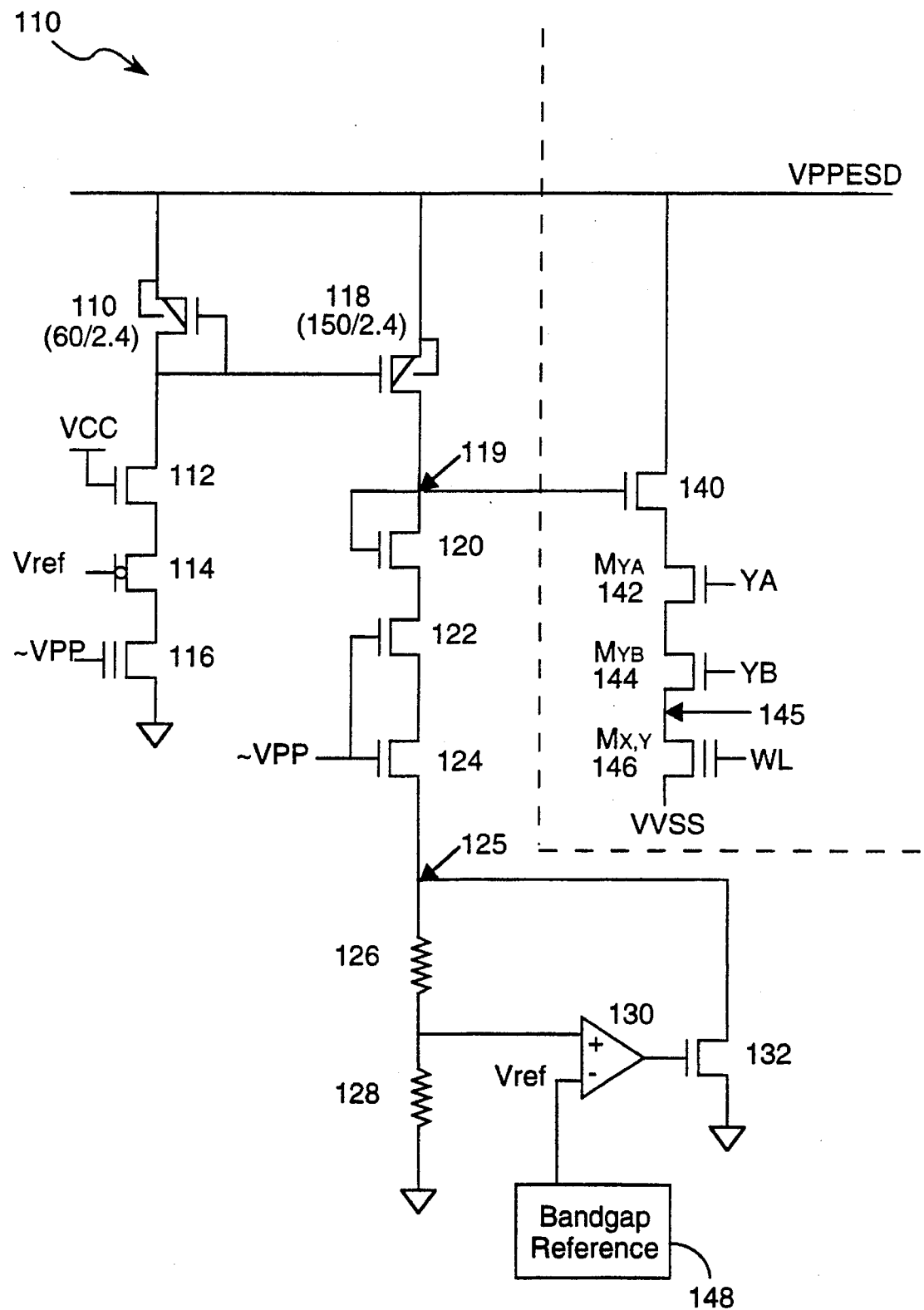
FIG. 3 depicts a program drain voltage control system for EPROM/flash, according to the present invention.

FIG. 3 shows a block diagram of the program drain voltage control circuit 110 of the present invention. This circuit, with obvious modifications, can be used with the flash array shown in FIG. 1, where there is a single y select transistor $M_Y$ per bit line, or other embodiments using different numbers of y select transistors. However, the embodiment of FIG. 3 is shown in use with the flash arrangement of FIG. 2. That is, the circuit 110, in cooperation with the programming data 100 and the input buffer 90, provides a drain voltage reference for the memory cells 146, which are coupled to the y select transistors 142 and 144. Note that the source of the flash cell 146 is shown coupled to a virtual ground node (WSS), which provides a source voltage that is at 0 VDC when the cell 146 is being programmed or read and at +5 VDC when the cell 146 is being erased.

The control circuitry 110 includes two branches, a current control branch (the left branch of FIG. 3) and a voltage control branch (the center branch). In the preferred embodiment, the voltage control branch, using a reliable reference voltage (Vref) generated from a band gap reference 148, controls the voltage at the node 119 so that the program drain voltage 145 of the flash cell 146 is held within ±0.3 VDC of the target program drain voltage (+6.1 VDC). This is accomplished using a comparator 130, one of whose differential inputs is coupled to Vref; a voltage divider constructed from the resistors 126 and 128; a pull-down transistor 132; and three n-channel transistors 120, 122, 124, each fabricated with the same length, width and threshold voltage (VT) as the transistors 140, 142, 144, respectively. To ensure that the target drain voltage 145 is achieved at currents that approximate the actual programming current of the flash cell 146, the p-channel transistor 118 provides a current that approximates the programming current of the flash cell 146.

Voltage control in the center branch is provided by a feedback circuit that includes the comparator 130, the voltage divider 126, 128 and the n-channel pull-down transistor 132. This feedback circuit maintains the voltage at the node 125 at +6.1 VDC (the target drain voltage) by comparing the voltage at the node 127 to the 1.28 VDC voltage reference (Vref). The sizes of the resistors 126 and 128 are chosen so the voltage drop across the N-well resistor 126 equals the difference of 6.1 VDC and 1.28 VDC for currents that approximate program drain currents. When the voltage at the node 125 is too high, the comparator 130 generates a high output 131, which momentarily turns on the n-channel transistor 132, which pulls down the node 125 until the voltage at the node 125 is re-established at 6.1 VDC.

The transistors 120, 122, 124 are used to mirror the 6.1 VDC target drain voltage at the node 125 to the drain of the flash cell 146 being programmed. As mentioned above, these transistors 120–124 are identical in length, width and threshold to the n-channel transistor 140 and the YA and YB select transistors 142, 144 coupled in series with the flash cell 146. During programming each of these six transistors is saturated. This is because, when the flash cell 146 is being programmed, the y-decoders 50A and 50B drive the YA and YB selects high (to VPP, which is at positive high voltage during programming), and the gates of the n-channel transistors 122, 124 are also tied to VPP. The gates of the n-channel transistors 120 and 140 are tied to the same node 119, the voltage at which is high enough to saturate the transistors 120, 140. Because the gate voltage (VG) of the transistor 140 is less than VPPESD, to which the drain of the transistor 140 is coupled, its source voltage is approximately the same (VG–VT) as that of the transistor 120. Therefore, because the sum of the voltage drops across the transistors 122, 124 will be approximately equal to the sum of the voltage drops across the transistors 142, 144, the voltage at the node 145 will be approximately the same as the voltage at the node 125 (6.1 VDC).

To ensure that the 6.1 VDC voltage at the node 125 even more closely approximates the drain voltage for the cell 146 during programming, the current in the center branch is set to mirror the programming current of an actual flash memory cell. This current matching is provided by the left hand, or current control, branch, which includes a p-channel transistor 110, a n-channel transistor 112, a n-channel native transistor 114 and an extra EPROM/flash cell 116, all of which are connected in series. This current matching branch is not necessary as the voltage regulation provided by the voltage control branch is adequate for most programming situations.

During programming, the gate of the native transistor 114 is held to Vref, which, as in the voltage control branch, is generated by the present invention from the stable, band gap reference voltage. By precisely holding Vref at 1.28 VDC, the native transistor 114 is lightly turned on (i.e., not driven into saturation) and, as a result, the drain voltage of the flash cell 116 is held at 0.9 VDC. This drain voltage can be accurately set based on the precisely-determined characteristics of the native transistor 114 as fabricated. With the drain of the flash cell 116 at +0.9 VDC and when VPP is held at high positive voltage (i.e., during programming), the flash memory cell 116 draws a small drain current, but one that is not large enough to result in programming. Based on the characteristics of the flash cell 116, this small drain current is known to be about 2.5 times smaller than the current drawn by the cell 116, or 146 during actual programming. The small drain current is then multiplied 2.5 times by the current mirror consisting of the interconnected transistors 110 and 118. Note that this factor (2.5) is provided by fabricating the transistor with a metal option that has the effect of increasing the effective width of the transistor 118 to 150, from 60. The multiplied current, which approximates the actual programming current of a normal flash cell, is then provided by the transistor 118 to the voltage control branch.

Modifications and variations may be made to the disclosed embodiments without departing from the subject and spirit of the invention as defined by the following claims.

What is claimed is:

1. A program drain voltage control system for use in an EPROM/flash memory system that includes a plurality of memory cells and a plurality of y selection transistors arranged in N-member subsets, each of which is connected in series with a respective memory cell, each y selection transistor in each subset having a gate that is responsive to a respective y select signal, so that, to program, read or erase a selected memory cell, said memory system must activate all y-select signals associated with said subset of y selection transistors coupled to said selected memory cell; said program drain voltage control system comprising:

a feedback control circuit that is configured to maintain a first node at a target drain voltage, said feedback circuit employing a reference voltage derived from a bandgap reference to ensure that said target drain voltage is stable;

a compensation circuit including a N-member set of pass transistors connected in series, said set of pass transistors being fabricated with same size and type as said y selection transistors, one end of said compensation circuit being coupled to said feedback control circuit at said first node; and a voltage mirroring circuit including first and second identically fabricated transistors whose gates are coupled to a second node, the voltage at said second node being determined by the voltage at a second end of said compensation circuit, said second end being coupled to the source of said first transistor, the source of said second transistor being coupled to an end of said subset of y select transistors distal to said memory cells;

such that, when said transistors composing said compensation network, said voltage mirror network and said y selection subset are saturated, said target drain voltage is mirrored at the drain of said flash memory cell within preset drain voltage variation limits.

2. The program drain voltage control system of claim 1, wherein said feedback control circuit comprises:

a comparator with two differential inputs, a first of said differential inputs being coupled to said voltage reference and a second of said differential inputs being coupled to a third node;

a voltage divider that includes:
  a first resistor connected between said first node and said third node; and
  a second resistor connected between said third node and a circuit ground node;

said first and second resistors being configured so that, when said first node is at said target drain voltage, said third node is at said reference voltage; and a n-channel pulldown transistor having a gate coupled to the output of said comparator, a drain coupled to said first node and a source coupled to said circuit ground node;

such that, when the voltage at said first node exceeds said target drain voltage, said comparator is configured to output a high signal that turns on said n-channel pulldown transistor, thereby pulling down said first node.

3. The program drain voltage control system of claim 1, wherein N is two and said y-selection transistors comprise n-channel transistors.

4. The program drain voltage control system of claim 1, wherein said target drain voltage is approximately 6.1 VDC.

5. The program drain voltage control system of claim 4, wherein said reference voltage is approximately 1.28 VDC.

6. The program drain voltage control system of claim 1, further comprising:

a current control branch including:
  an extra flash memory cell that is fabricated identically to said plurality of flash memory cells, the control gate of said extra flash memory cell being driven by a positive high voltage signal when said memory system is in a program mode;
  a voltage setting circuit that is configured to set the drain voltage of said extra flash memory cell to a predetermined voltage that is large enough to turn on said extra cell but not program said extra cell; such that, when said memory system is in said program mode and when said drain voltage of said extra memory cell is set to said predetermined voltage, said extra cell draws a reference current that is a known fraction of drain current drawn by any of said plurality of memory cells during programming; and
  a current mirror coupled to the end of said voltage setting circuit that is distal to the drain of said extra memory cell, said current mirror multiplying said reference current by the reciprocal of said known fraction and providing at said second node a second current for use by said feedback and compensation circuit that approximates said programming current within accepted limits.

7. The program drain voltage control system of claim 6, wherein said voltage setting circuit comprises:

a n-channel native transistor whose gate is coupled to said reference voltage and whose source is coupled to the drain of said extra flash cell; and a n-channel transistor whose gate is coupled to VCC and whose source is coupled to the drain of said n-channel native transistor, the drain of said n-channel transistor being said distal end of said voltage setting circuit.

8. The program drain voltage control system of claim 6, wherein said reference voltage is approximately 1.28 VDC.

9. The program drain voltage control system of claim 6, wherein said reciprocal of said known fraction is 2.5.

10. The program drain voltage control system of 6, wherein said current mirror comprises:

a first p-channel transistor having interconnected drain and gate, said first transistor's drain being coupled to said distal end of said voltage setting circuit and said first transistor's source being coupled to VPPESD (VPP external); and a second p-channel transistor having a gate coupled with said first transistor's gate, said second transistor's source being coupled to VPPESD (VPP external), and said second transistor having a channel width that is effectively wider than said first transistor by a multiplication factor equaling said reciprocal of said known fraction so that said second transistor draws a drain current that is larger by said multiplication factor than the drain current drawn by said first transistor at the same gate voltage.

11. The program drain voltage control system of 10, wherein said second transistor has the same width as said first transistor and achieves said effectively wider channel width through the use of a metal option.

* * * * *